(12) United States Patent
Meng et al.

(10) Patent No.: US 11,405,737 B2
(45) Date of Patent: *Aug. 2, 2022

(54) METHOD FOR MANUFACTURING MEMS MICROPHONE

(71) Applicant: AAC Acoustic Technologies (Shenzhen) Co., Ltd., Shenzhen (CN)

(72) Inventors: Zhenkui Meng, Shenzhen (CN); Zhengyan Liu, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 267 days.

This patent is subject to a terminal disclaimer.

(21) Appl. No.: 16/708,427

(22) Filed: Dec. 9, 2019

(65) Prior Publication Data

US 2020/0213797 A1 Jul. 2, 2020

(30) Foreign Application Priority Data

Dec. 31, 2018 (CN) .......................... 201811651276.0

(51) Int. Cl.
*H04R 31/00* (2006.01)
*B81B 3/00* (2006.01)
(Continued)

(52) U.S. Cl.
CPC .......... *H04R 31/003* (2013.01); *B81B 3/001* (2013.01); *B81B 3/0021* (2013.01); *B81C 1/00158* (2013.01); *B81C 1/00968* (2013.01); *H04R 19/04* (2013.01); *B81B 2201/0257* (2013.01); *B81B 2203/0127* (2013.01); (Continued)

(58) Field of Classification Search
CPC ............................ H04R 31/003; H04R 19/04; H04R 2201/003; H04R 2499/11; H04R 19/005; H04R 31/00; B81B 3/001; B81B 3/0021; B81B 2201/0257; B81B 2203/0127; B81B 2203/0315; B81B 2203/04; B81C 1/00158; B81C 1/00968; B81C 2201/013; B81C 2201/016; B81C 2201/0178; B81C 2201/053

See application file for complete search history.

(56) References Cited

U.S. PATENT DOCUMENTS

| 10,979,825 | B2 * | 4/2021 | Meng | ...................... H04R 19/04 |
| 2020/0204925 | A1 * | 6/2020 | Zou | .......................... H04R 7/02 |
| 2021/0168497 | A1 * | 6/2021 | Wen | ........................ H04R 1/283 |

FOREIGN PATENT DOCUMENTS

| CN | 104254046 B2 | 12/2014 |
| CN | 110012410 A1 | 7/2019 |

OTHER PUBLICATIONS

PCT search report dated Jan. 8, 2020 by SIPO in related PCT Patent Application No. PCT/CN2019/113335 (4 Pages).

* cited by examiner

*Primary Examiner* — Matthew A Eason
(74) *Attorney, Agent, or Firm* — W&G Law Group

(57) ABSTRACT

The invention provides a method for manufacturing a MEMS microphone, including the steps of: providing a base and preparing a first diaphragm on a first surface of the base; preparing a back plate on a surface of the first diaphragm opposite to the first surface; forming a first gap between the first diaphragm and the back plate; preparing a second diaphragm; forming a second gap between the second diaphragm and the back plate; preparing electrodes; forming a back cavity by etching the surface opposite to the first surface.

9 Claims, 8 Drawing Sheets

(51) Int. Cl.
B81C 1/00 (2006.01)
H04R 19/04 (2006.01)
(52) U.S. Cl.
CPC ... *B81B 2203/0315* (2013.01); *B81B 2203/04* (2013.01); *B81C 2201/013* (2013.01); *B81C 2201/016* (2013.01); *B81C 2201/0178* (2013.01); *B81C 2201/053* (2013.01); *H04R 2201/003* (2013.01)

METHOD FOR MANUFACTURING MEMS MICROPHONE

FIELD OF THE PRESENT DISCLOSURE

The invention relates to a microphone technology, in particular to a method for manufacturing a MEMS (Micro-Electro-Mechanic Systems) microphone.

DESCRIPTION OF RELATED ART

With the development of wireless communication, the users have increasingly higher requirements for the call quality of mobile phones, and the design of microphone as a speech pickup device has a direct influence on the call quality of mobile phone.

As MEMS technology is featured by miniaturization, good integratability, high performance, low cost and the like, it has been appreciated by the industry, and MEMS microphone is widely used in current mobile phones; the common MEMS microphone is capacitive, i.e., including a vibrating diaphragm and a back plate which both constitutes a MEMS Acoustic sensing capacitance, and the MEMS acoustic sensing capacitance further outputs an acoustic signal to a processing chip for signal processing by connecting to the processing chip through a connecting plate. To further improve the performance of MEMS microphone, a dual-diaphragm MEMS microphone structure has been proposed in the prior art, i.e., two layers of vibrating diaphragm are used to constitute a capacitance structure with the back plate respectively. In the MEMS microphone based on silicon technology, the vibrating diaphragm and back plate of the above MEMS microphone are on the same silicon foundation and made with semiconductor making process, and it also comprises process steps such as forming an acoustic cavity, back cavity, acoustic hole, venting hole and connecting plate during manufacturing.

As each making process step of MEMS microphone is to make and form on the same silicon base, each process step can only be conducted after the previous process step is finished, thus causing a relatively low efficiency of manufacturing MEMS microphone.

Based on the above problems, it's necessary to provide a new method for manufacturing MEMS microphone dual-diaphragm structure to improve manufacturing efficiency.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

Figure 1:
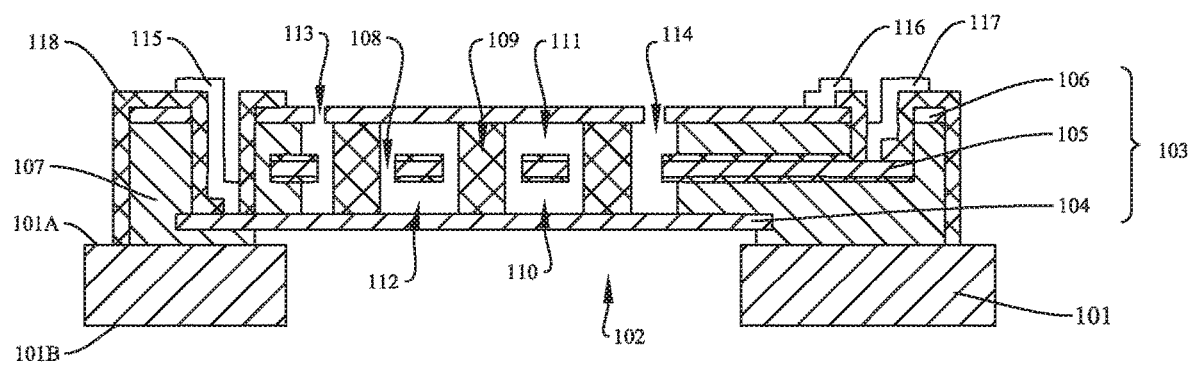
FIG. 1 is an illustration of a MEMS microphone in one embodiment of the invention.
Figure 2:
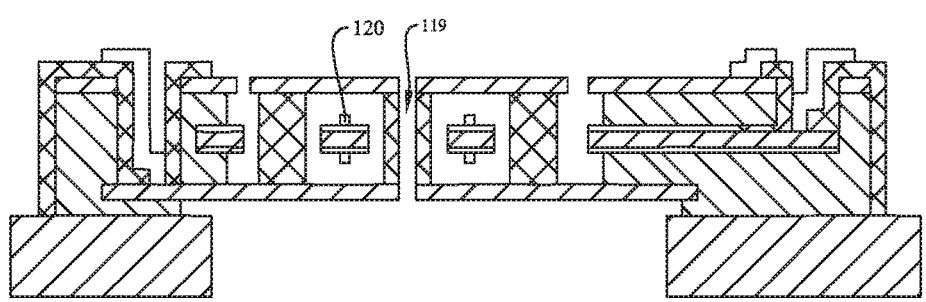
FIG. 2 is an illustration of the MEMS microphone in another embodiment of the invention.

With reference to FIGS. 1-2, a MEMS microphone structure 100 prepared by the manufacturing method of the invention comprises a base 101 and a capacitance system 103 placed on the base 101 and insulatively connected with the base 101.

The material of the base 101 is preferably semiconductor material, such as silicon, which has a back cavity 102, a first surface 101A and a second surface 101B opposite to the first surface, an insulation layer 107 provided on the first surface 101A of the base 101 with a back cavity 102 through the insulation layer 107, and the first and second surfaces of the base 101. Wherein the back cavity 102 can be formed through corrosion by a bulk-silicon process and dry method. Correspondingly, in the description below, the first surface 101A reflects an upper side, and the second surface 101B reflects a lower surface side.

The capacitance system 103 comprises a back plate 105 and a first vibrating diaphragm 104 and a second vibrating diaphragm 106 provided opposite to the back plate 105 at the two upper and lower sides of the back plate 105 respectively, with an insulation layer 107 provided between all the first vibrating diaphragm 104 and the back plate 105, the second vibrating diaphragm 106 and the back plate 105, the vibrating diaphragm 104 and the base 101.

A first isolative gap 110 is formed between the first diaphragm 104 and the back plate 105, and a second isolative gap 111 is formed is formed between the second diaphragm 106 and the back plate 105. The back plate 105 comprises an acoustic through hole 108. The supporting part 109 penetrates through the acoustic through hole 108 to fixedly connect the first vibrating diaphragm 104 with the second vibrating diaphragm 106. Specifically, the supporting part 109 is abutted with an upper surface of the first vibrating diaphragm 104 and a lower surface of the second vibrating diaphragm 106 respectively.

The first isolative gap 110 communicates with the second isolated gap 111 for forming an inner cavity 112. When the MEMS microphone is powered on to work, the first vibrating diaphragm 104 and the back plate 105, the second vibrating diaphragm 106 and the back plate 105 will carry charges of opposite polarity to form capacitance, when the first vibrating diaphragm 104 and the second vibrating diaphragm 106 vibrate under the action of acoustic wave, the distance between the back plate 105 and the first vibrating diaphragm 104, between it and the second vibrating diaphragm 106 will change, so as to cause changes in capacitance of the capacitance system, which in turn converts the acoustic wave signal into an electrical signal to realize corresponding functions of the microphone.

In this embodiment, the first vibrating diaphragm 104 and the second vibrating diaphragm 106 are square, round or elliptical, at least one supporting part 109 is placed between the lower surface of the first vibrating diaphragm 104 and the upper surface of the second vibrating diaphragm 106.

The supporting part 109 is placed to penetrate through the acoustic through hole 108 of the back plate 105 to fixedly connect the first vibrating diaphragm 104 and the second vibrating diaphragm 106; i.e., the supporting part 109 has no contact with the back plate 105 and no influence from the back plate 105.

The supporting part 109 can be formed on the top surface of the first vibrating diaphragm 104 with all kinds of preparing technology, such as physical vapor deposition, electrochemical deposition, chemical vapor deposition and molecular beam epitaxy.

The supporting part 109 can be constituted by semiconductor material such as silicon or can comprise semiconductor material such as silicon. For example, germanium, SiGe, silicon carbide, gallium nitride, indium, indium gallium nitride, indium gallium arsenide, indium gallium zinc oxide or other element and/or compound semiconductor (e.g., III-V compound semiconductor or II-VI compound semiconductor such as gallium arsenide or indium phosphide, or ternary compound semiconductor or quaternary compound semiconductor). It can also be constituted by or comprise at least one of the followings: metal, dielectric material, piezoelectric material, piezoresistive material and ferroelectric material. It can also be made from dielectric material such as silicon nitride.

According to the embodiments, the supporting part 109 can be integrally molded with the first vibrating diaphragm 104 and the second vibrating diaphragm 106.

According to the second embodiment, the second vibrating diaphragm 106 of the invention comprises a first releasing hole 113 and a second releasing hole 114 located on a periphery of the second diaphragm for communicating with the most outer acoustic through hole 108 of the back plate 105.

The first and second releasing holes 113, 114 are communicated with the internal cavity 112, so it allows to eliminate the sacrifice oxidation layer inside the internal cavity 112 by using a releasing solution such as BOE solution or HF vapor-phase etching technology.

According to the embodiments, it also comprises the extraction electrodes of the first vibrating diaphragm 104, the second vibrating diaphragm 106 and the back plate 105, correspondingly a first electrode 115, a second electrode 116, a third electrode 117.

According to the embodiments, it also comprises a passivation protective layer of surface 118 which simultaneously has a function to achieve mutual insulation among the first electrode 115, the second electrode 116, and the third electrode 117. The passivation protective layer of surface 118 is made from silicon nitride.

Refer to FIG. 2, the MEMS microphone further comprises a through hole 119 through the first vibrating diaphragm 104, the supporting part 109, the second vibrating diaphragm 106, the through hole 119, for example, is placed at the central position of the first vibrating diaphragm 104, the second vibrating diaphragm 106, communicating the back cavity 102 with the external environment, thus resulting in a consistent external pressure of the first vibrating diaphragm 104 and the second vibrating diaphragm 106.

The MEMs microphone further includes a plurality of bumps 120 located on the upper and lower surfaces of the back plate 105 for preventing the first and second diaphragms from adhering to the back plate 105.

Figure 3:
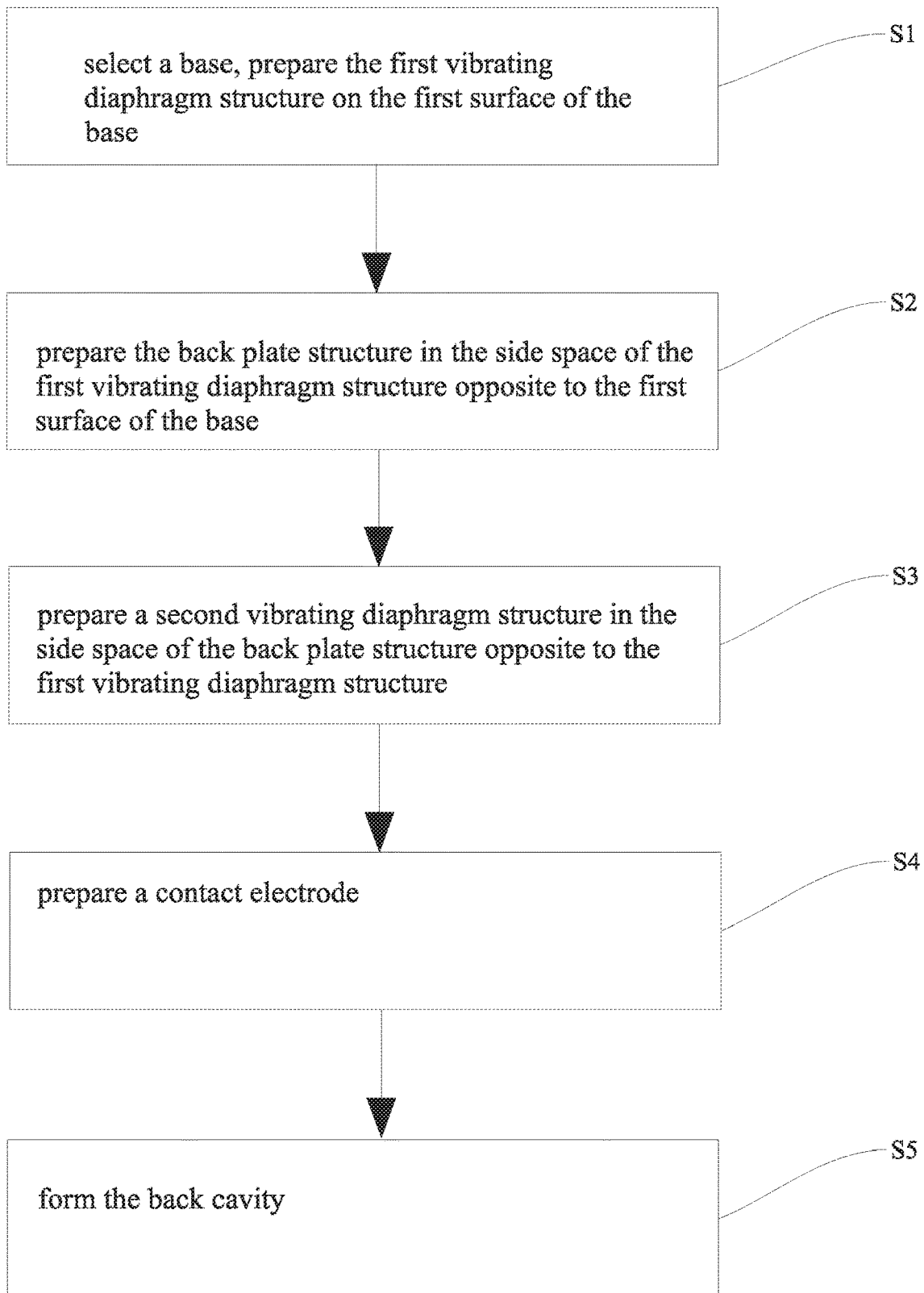
FIG. 3 is a flow chart of a method for manufacturing the MEMS microphone.
Figure 4A:
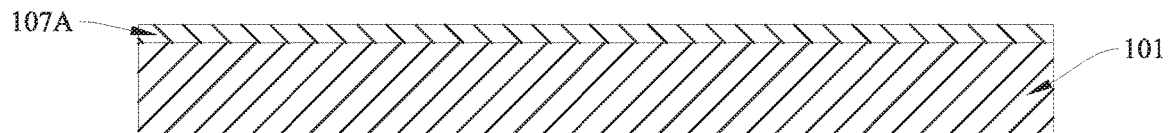
FIG. 4A-4S indicates the steps of the method for manufacturing the MEMS microphone.

Refer to FIG. 3, a method for manufacturing the MEMS microphone mentioned above includes the steps of:

Step S1, select a base, prepare the first vibrating diaphragm structure on the first surface of the base:

Specifically, it comprises the following sub-steps:

S11, select the base 101, and deposit the first oxidation layer 107A on the first surface 101A of the base 101, as shown in FIG. 4A.

The base 101, for example, is a semiconductor silicon substrate, or a substrate of other semiconductor material such as: germanium, SiGe, silicon carbide, gallium nitride, indium, indium gallium nitride, indium gallium arsenide, indium gallium zinc oxide or other element and/or compound semiconductor (e.g., III-V compound conductor such as gallium arsenide or indium phosphide) germanium or and gallium nitride the like.

The first oxidation layer 107A, for example, is a silicon dioxide with a thickness of about 1 μm, formed by a regular process such as thermal oxidation and vapor deposition.

Figure 4B:
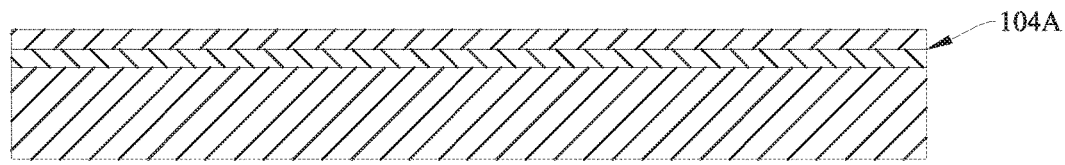
Figure 4C:

S12, deposit a first polycrystalline silicon layer 104A on the first oxidation layer 107A, the first polycrystalline silicon layer 104A, for example, has a thickness of about 1 μm, as shown in FIG. 4B;

S13, etch the first polycrystalline silicon 104A, according to the structural requirements for the first vibrating diaphragm 104, etch the first polycrystalline silicon layer 104A to form a basic structure of the first vibrating diaphragm 104, as shown in FIG. 4C.

Figure 4D:
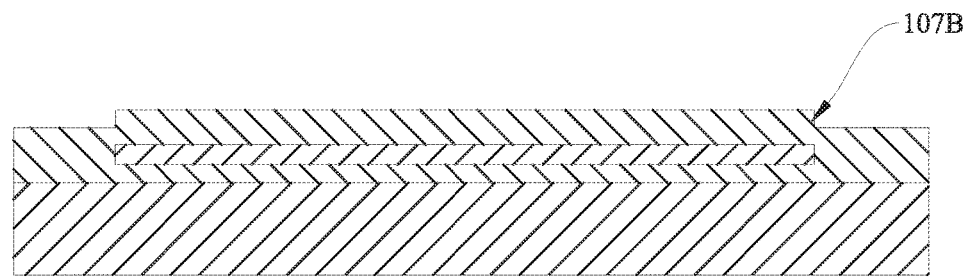
Figure 4E:
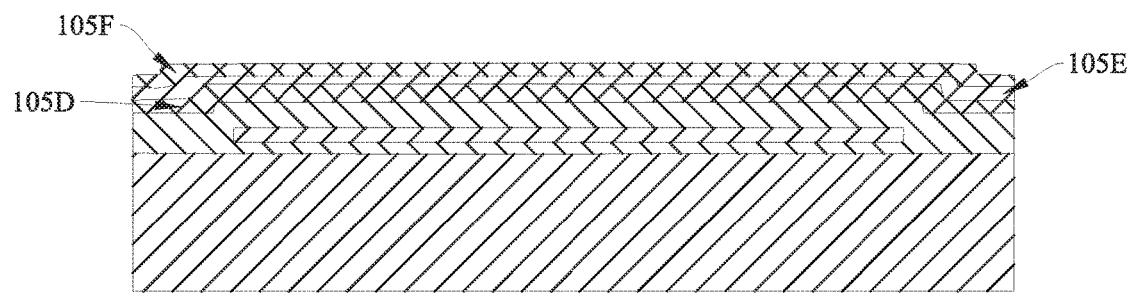

Step S2, prepare the back plate structure in the side space of the first vibrating diaphragm structure opposite to the first surface of the base:

Specifically, it comprises the following sub-steps:

S21, deposit the second oxidation layer 107B on the first vibrating diaphragm structure 104, the second oxidation layer 107B, for example, has a thickness of 0.5 μm, as shown in FIG. 4D; preferably, it also allows to etch the second oxidation layer 107B to form a bump prepared as a groove structure, so as to prevent the adhesion of the back plate 105 with the first vibrating diaphragm 104.

S22, deposit the material layer of back plate, in this embodiment, the back plate structure comprises a first nitride silicon layer 105D, a second polycrystalline silicon layer 105E, a second nitride silicon layer 105F overlapped from bottom to the top, wherein the first nitride silicon layer 105D covers the second oxidation layer 107A; the first nitride silicon layer 105D, the second nitride silicon layer 105F, for example, have a thickness of about 0.25 μm, the second polycrystalline silicon layer 105E in the middle, for example, has a thickness of about 0.5 μm.

Figure 4F:
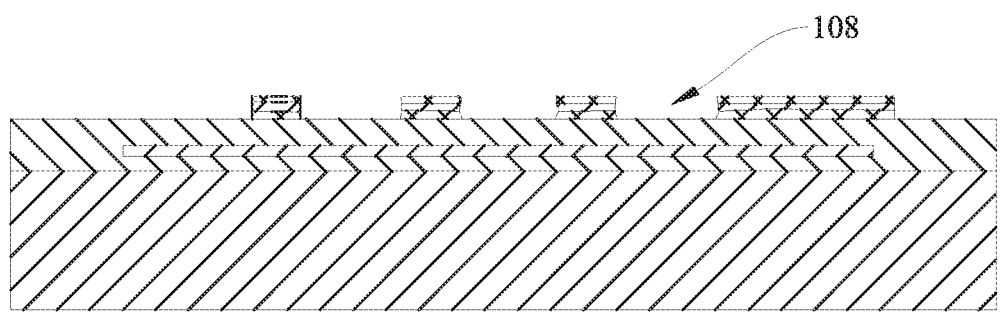

S23, etch the material layer of back plate to form an acoustic through hole 108 placed in interval; as shown in FIG. 4F;

Preferably, it also comprises a step of preparing a bump on the surface of the second nitride silicon layer 105F of the back plate.

Figure 4G:
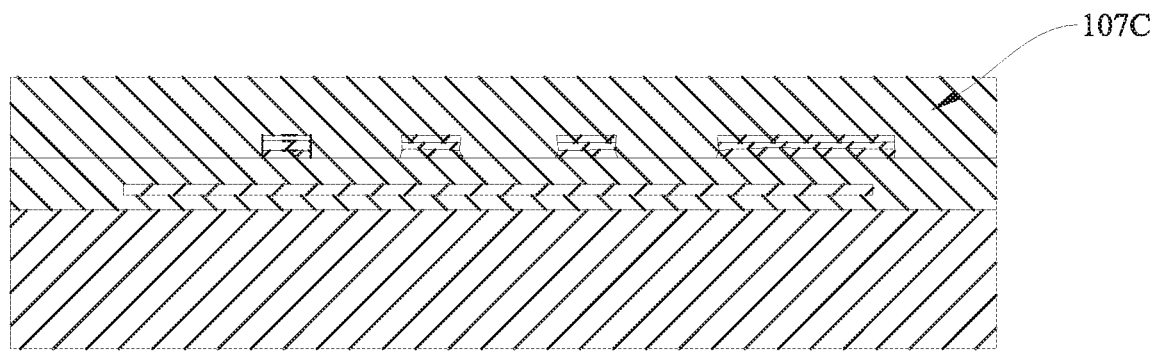

Step S3, prepare a second vibrating diaphragm structure in the side space of the back plate structure opposite to the first vibrating diaphragm structure;

Specifically, it comprises the following sub-steps:

S31, deposit the third oxidation layer 107C on the upper surface of the back plate; as shown in FIG. 4G, the planarization in this embodiment refers to, for example, using chemical mechanical polishing (CMP) process.

Figure 4H:
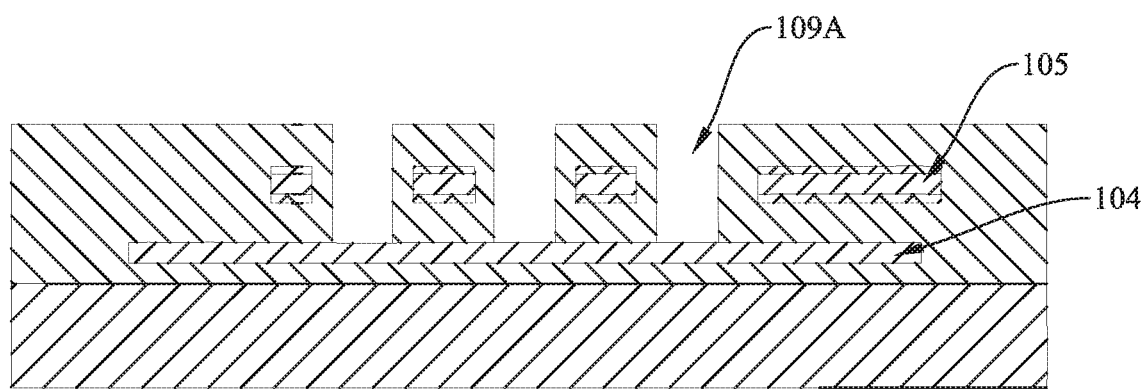
Figure 4I:
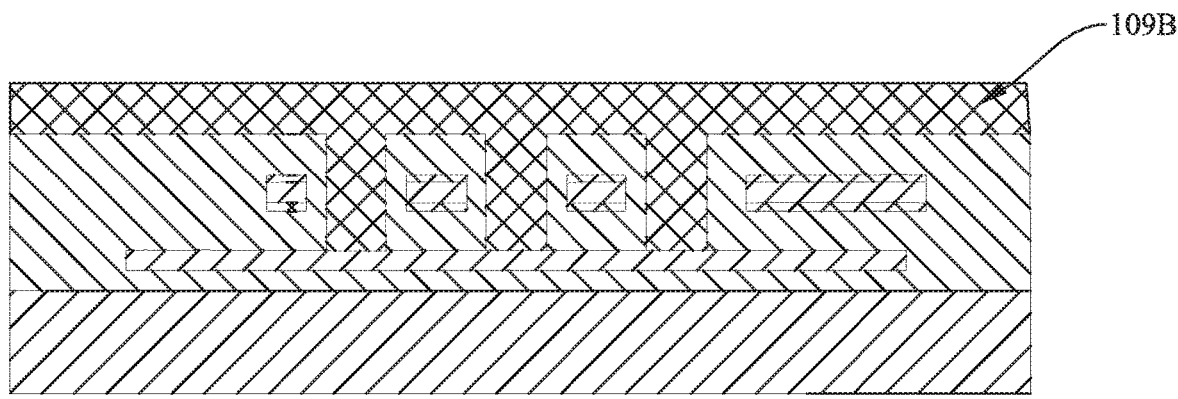
Figure 4J:
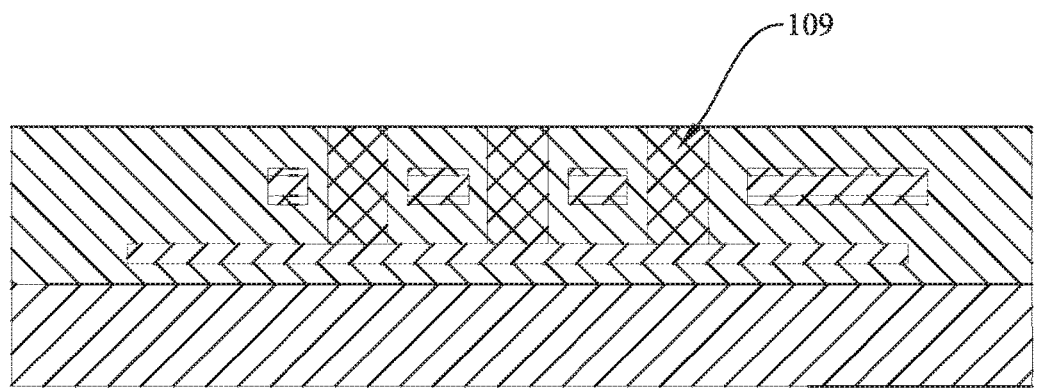
Figure 4K:
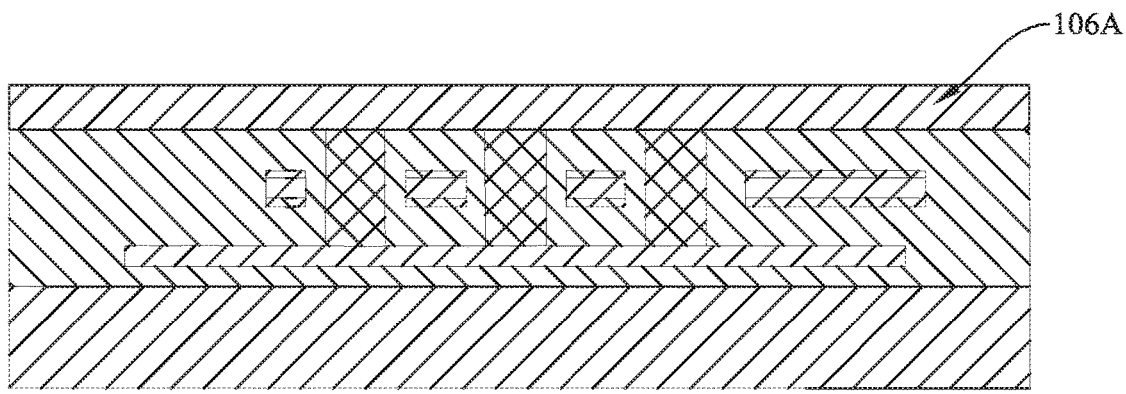
Figure 4L:
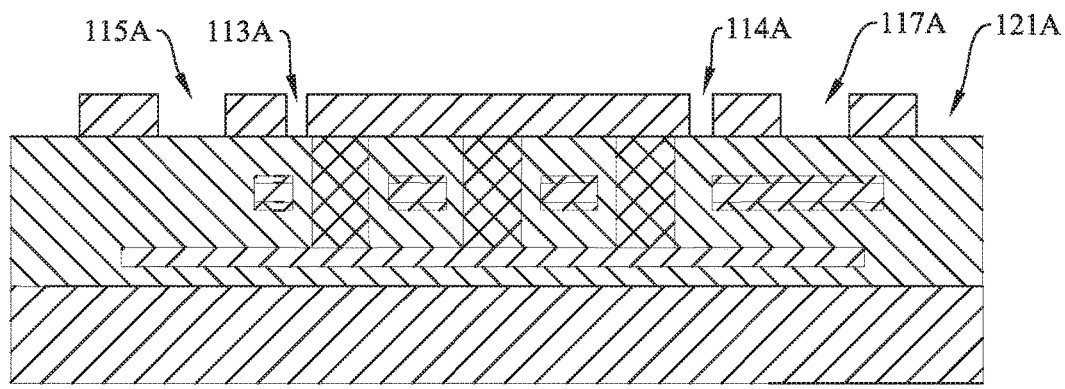

S32, etch the third oxidation layer 107C, form a deposition hole of supporting part 109A of the supporting part 109, the deposition hole 109A is in the acoustic through hole 108 of the back plate, exposed from the upper surface of the first vibrating diaphragm structure 104, as shown in FIG. 4H;

S33, deposit the third nitride silicon layer 109B to fill up the deposition hole 109A; the thickness of the third nitride silicon layer 109B is, for example, enough to completely fill up the deposition hole 109A, about 4 micrometers, as shown in FIG. 4I;

S34, eliminate the third nitride silicon layer 109B beyond the deposition hole of supporting part 109A for forming the supporting part 109, for example, by using CMP process, as shown in FIG. 4J;

S35, deposit the third polycrystalline silicon film 106A, the thickness of the third polycrystalline silicon film 106A is 1 μm, as shown in FIG. 4K;

S36, etching the third polycrystalline silicon film 106A layer, forming the first releasing hole window 113A, the second releasing hole window 114A, the first electrode window 115A, the third electrode window 117A, and the device edge area window 121A. The releasing hole 111; obviously, the releasing hole window 113A/114A is located on the acoustic hole 108 in the upper edge area of the back plate 105; the first electrode window 115A and the third electrode window 117A are used to form the electrode outlet holes of the first diaphragm 104 and the back plate 105; the device edge area window 121A is used to remove the oxide layer 107 in the edge area of the MEMS microphone, forming the device isolation area and the scribing area, as shown in FIG. 4L.

Figure 4M:
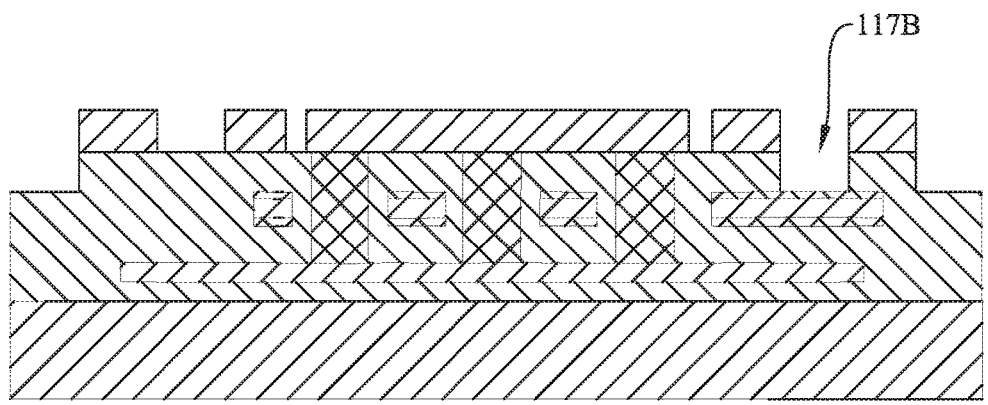

S37, etch along the first electrode window 115A to form the outlet hole 115B exposing the first diaphragm 104; meanwhile, etch the oxide layer under the window 121A to expose the first surface 101A of the base, as shown in FIG. 4M.

Figure 4N:
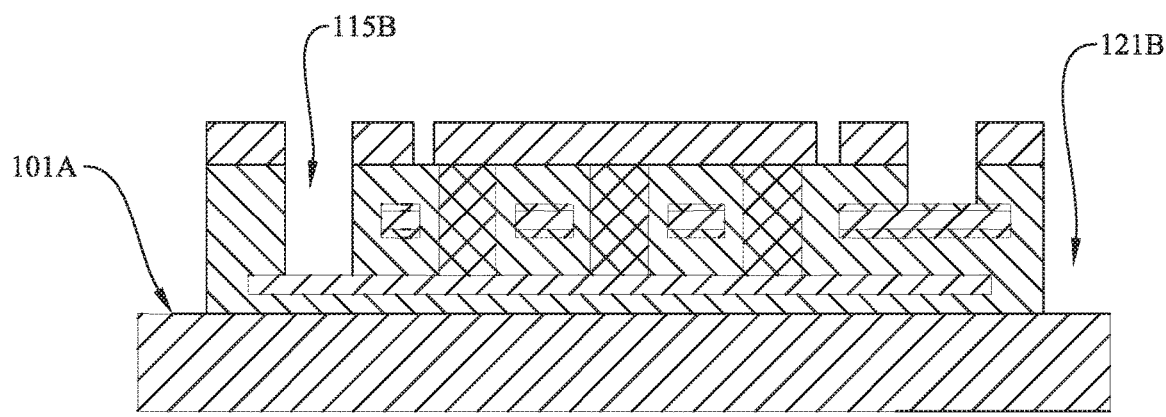

S38, etch along the first electrode window 115A to form the outlet hole 115B exposing the first diaphragm 104; meanwhile, etch the oxide layer under the window 121A to expose the first surface 101A of the base, as shown in FIG. 4N.

Step S4, prepare a contact electrode

Figure 4O:
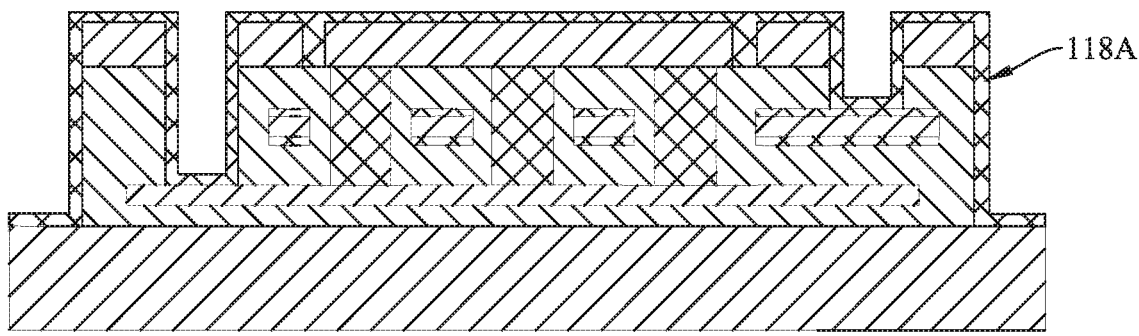
Figure 4P:
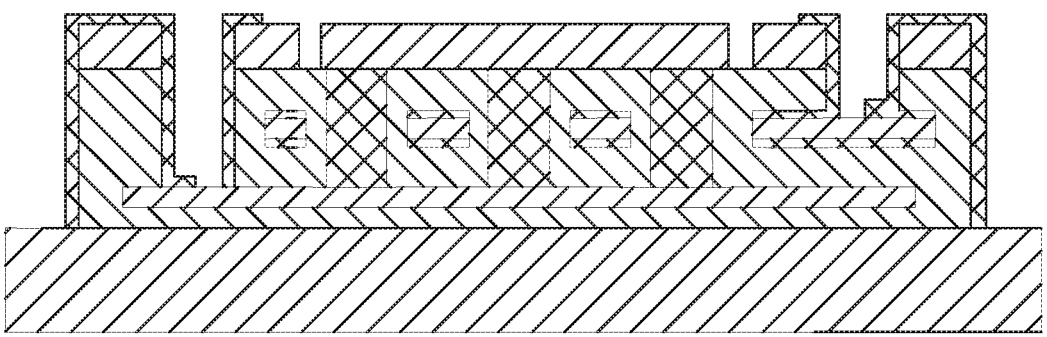
Figure 4Q:
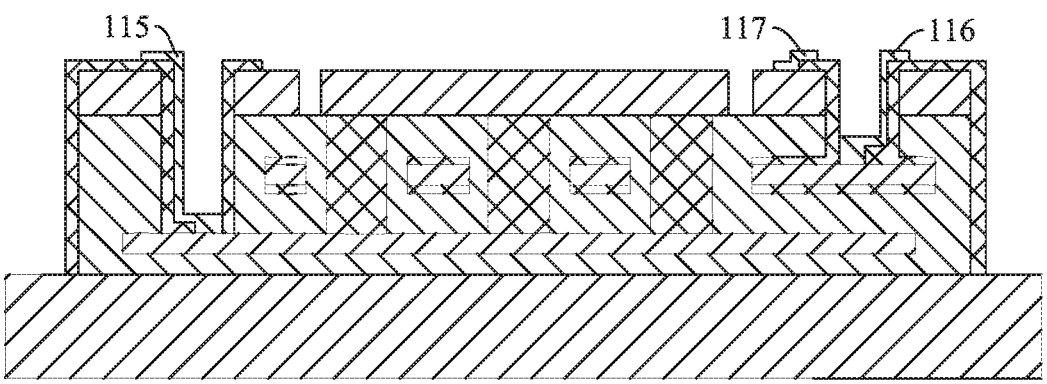

Specifically, it comprises the following sub-steps:

S41, a passivation protective layer 118A is deposited on the surface of the whole device, the passivation layer is silicon nitride for example, as shown in FIG. 4O;

S42, etching the passivation layer 118A, exposing the contact area of the first diaphragm 104, the second diaphragm 106, and the back plate 105, as shown in FIG. 4P;

S43, a metal layer is deposited and patterned, such as Cr and Cu alloy. The patterned metal layer forms a conductive contact point on the upper surface of the first polycrystalline silicon, the second polycrystalline silicon and the third polycrystalline silicon, that is, the electrode 115 led corresponding to the first diaphragm 104, the electrode 116 led corresponding to the second diaphragm 106 and the electrode 117 led corresponding to the back plate 105, as shown in FIG. 4Q;

Step 5, form the back cavity

Figure 4R:
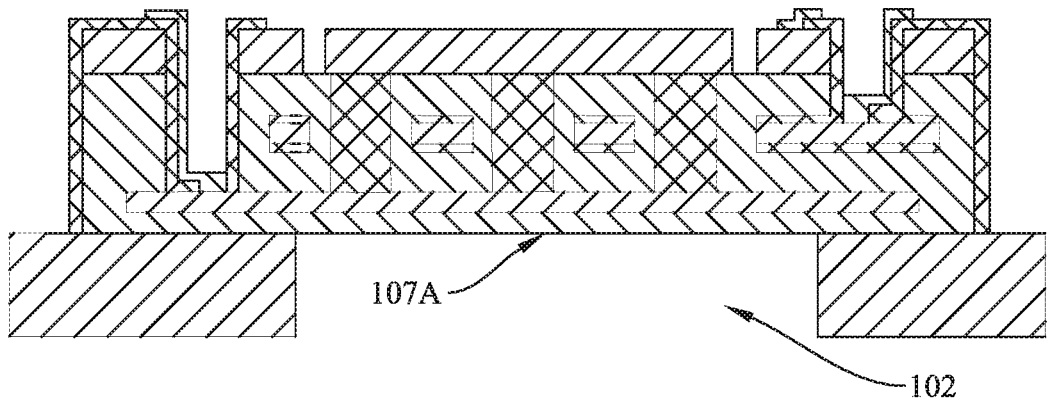
Figure 4S:
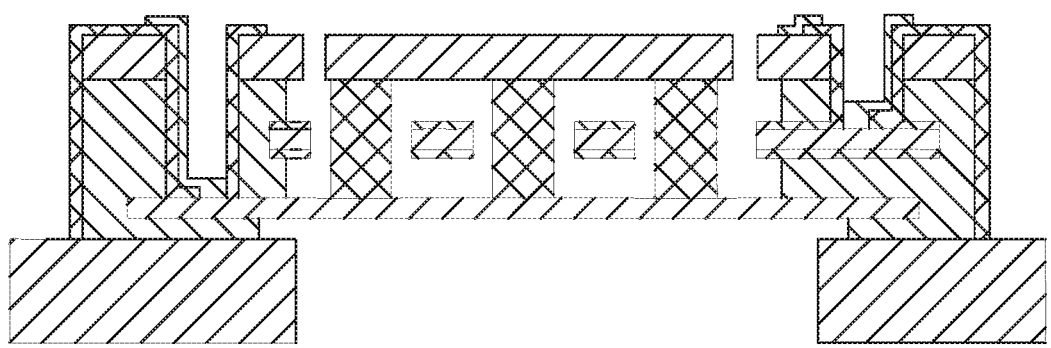

Specifically, it comprises the following steps:

S51, the back surface of the base is thinned, for example, the back surface of the base 101 is thinned by the grinding process;

S52, the second surface 101B of the patterned base is etched to form a back cavity region 102, and the etching stops at the first oxide layer 107A, as shown in FIG. 4R;

S53, release the first diaphragm 104, back plate 105, and second diaphragm 106, for example, using BOE solution or HF gas phase etching technology, the oxide layer between the first diaphragm 104 and the second diaphragm 106 is removed; and the oxide layer above the back cavity 102 is removed; the first insulation gap 110 between the first polycrystalline silicon layer and the back plate and the second insulation gap 111 between the third polycrystalline silicon and the backplane are formed. The size of the acoustic through hole 108 on the back plate is larger than that of the supporting component 109, so a connected cavity 112 is formed between the first polycrystalline silicon layer 104A and the third polycrystalline silicon layer 106A. shown in FIG. 4S.

Preferably, it also comprises the step of forming a through hole 119 of the supporting part through the central area of the device, to form the MEMS microphone as shown in FIG. 2.

Preferably, it also comprises the step of forming an anti-adhesion bump 120 on the upper and lower surfaces of the back plate.

The invention provides a manufacturing method of MEMS microphone, which is easy to integrate with other semiconductor devices through standard semiconductor process preparation.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A method for manufacturing a MEMS microphone, comprising steps of:
   selecting a base, depositing a first oxidation layer on the first layer of the base;
   depositing a first polycrystalline silicon layer on the surface of the first oxidation layer and patterning the first polycrystalline silicon layer to form a first vibrating diaphragm structure;
   depositing a second oxidation layer on the surface of the first vibrating diaphragm structure,
   depositing a material layer of back plate on the surface of the second oxidation layer,
   patterning the material layer of back plate to form a back plate structure, wherein the back plate structure comprises multiple acoustic through holes;
   depositing a third oxidation layer on the back plate structure, and flattening the third oxidation layer;
   patterning the third oxidation layer and the second oxidation layer, forming a deposition hole of supporting part between the acoustic through holes, wherein the deposition hole of supporting part is exposed from the first vibrating diaphragm structure;
   depositing the material layer of supporting part until it fills up the deposition hole of supporting part;
   flattening the material layer of supporting part until the surface of the third oxidation layer is exposed;
   depositing a second material layers of vibrating diaphragm, and patterning the second vibrating diaphragm material layer to form the second diaphragm structure and to form releasing holes on the second diaphragm structure corresponding to a periphery of the back plate structure;
   preparing the extraction electrodes of the first vibrating diaphragm structure, the second vibrating diaphragm structure and the back plate structure;
   back-etching the base to form a back cavity area corresponding to the central main body area of the back plate structure;
   releasing the second oxide layer and the third oxide layer between the first diaphragm structure and the second diaphragm structure corresponding to the middle main body area of the back plate structure through the releasing hole, and releasing the first oxide layer above the back cavity structure through the back cavity structure.

2. The method for manufacturing the MEMS microphone as described in claim 1, wherein the step of the depositing of the material layer of back plate comprises a step of depositing a first nitride silicon layer, a second polycrystalline silicon layer and a second nitride silicon layer.

3. The method for manufacturing the MEMS microphone as described in claim 1, wherein the step of depositing of the extraction electrodes of the first vibrating diaphragm structure, the second vibrating diaphragm structure and the back plate structure comprises steps of:
   etching to form electrode extraction holes of the first vibrating diaphragm structure, the back plate structure and the second vibrating diaphragm structure;
   depositing and patterning the electrode layer, form the first extraction electrode of the first vibrating diaphragm structure, the second extraction electrode of the second vibrating diaphragm structure, the third extraction electrode of the back plate structure.

4. The method for manufacturing the MEMS microphone as described in claim 1, wherein the step of depositing the material layer of supporting part is depositing a third nitride silicon layer on the patterned third oxidation layer.

5. The method for manufacturing the MEMS microphone as described in claim 1, wherein the forming of a back cavity structure comprises:
   thinning and etching the base from the second surface of the base.

6. The method for manufacturing the MEMS microphone as described in claim 3, further including a step of depositing a passivation protective layer after forming the electrode extraction hole.

7. The method for manufacturing the MEMS microphone as described in claim 6, wherein the electrode layer comprises a Cr/Au layer.

8. The method for manufacturing the MEMS microphone as described in claim 1, further comprising a step of forming a through hole through the supporting part, the first vibrating diaphragm structure, and the second vibrating diaphragm structure.

9. The method for manufacturing the MEMS microphone as described in claim 1, further including a step of forming a bump on the upper and lower surfaces of the central main body area of the back plate structure.

* * * * *